United States Patent
Coolbaugh et al.

(10) Patent No.: US 7,439,151 B2
(45) Date of Patent: Oct. 21, 2008

(54) METHOD AND STRUCTURE FOR INTEGRATING MIM CAPACITORS WITHIN DUAL DAMASCENE PROCESSING TECHNIQUES

(75) Inventors: Douglas D. Coolbaugh, Highland, NY (US); Timothy J. Dalton, Ridgefield, CT (US); Ebenezer Eshun, Newburgh, NY (US); Vincent J. McGahay, Poughkeepsie, NY (US); Anthony K. Stamper, Williston, VT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 11/531,298

(22) Filed: Sep. 13, 2006

(65) Prior Publication Data

US 2008/0064163 A1   Mar. 13, 2008

(51) Int. Cl.
    *H01L 21/20*   (2006.01)
(52) U.S. Cl. .............. 438/387; 438/389; 257/E21.016
(58) Field of Classification Search ............... 438/387, 438/389, 391; 257/E21.016
    See application file for complete search history.

(56) References Cited

U.S. PATENT DOCUMENTS

| | | | |
|---|---|---|---|
| 5,946,567 A | 8/1999 | Weng et al. | |
| 6,140,693 A | 10/2000 | Weng et al. | |
| 6,479,341 B1 | 11/2002 | Lu | |
| 6,569,746 B2 | 5/2003 | Lee et al. | |
| 6,649,464 B2 | 11/2003 | Lee | |
| 6,670,237 B1 | 12/2003 | Loh et al. | |
| 6,770,926 B2 | 8/2004 | Kim | |
| 6,838,352 B1 * | 1/2005 | Zhao | 438/386 |
| 7,115,467 B2 * | 10/2006 | Ajmera et al. | 438/253 |
| 7,329,955 B2 * | 2/2008 | Tsau | 257/758 |
| 7,361,549 B2 * | 4/2008 | Bruchhaus et al. | 438/253 |
| 2002/0197844 A1 * | 12/2002 | Johnson et al. | 438/618 |
| 2005/0275005 A1 * | 12/2005 | Choi et al. | 257/300 |

* cited by examiner

*Primary Examiner*—Scott B. Geyer
*Assistant Examiner*—Seahvosh J Nikmanesh
(74) *Attorney, Agent, or Firm*—Cantor Colburn LLP; Joseph Petrokaitis

(57) ABSTRACT

A method for integrating the formation of metal-insulator-metal (MIM) capacitors within dual damascene processing includes forming a lower interlevel dielectric (ILD) layer having a lower capacitor electrode and one or more lower metal lines therein, the ILD layer having a first dielectric capping layer formed thereon. An upper ILD layer is formed over the lower ILD layer, and a via and upper line structure are defined within the upper ILD layer. The via and upper line structure are filled with a planarizing layer, followed by forming and patterning a resist layer over the planarizing layer. An upper capacitor electrode structure is defined in the upper ILD layer corresponding to a removed portion of the resist. The via, upper line structure and upper capacitor electrode structure are filled with conductive material, wherein a MIM capacitor is defined by the lower capacitor electrode, first dielectric capping layer and upper capacitor electrode structure.

19 Claims, 16 Drawing Sheets

METHOD AND STRUCTURE FOR INTEGRATING MIM CAPACITORS WITHIN DUAL DAMASCENE PROCESSING TECHNIQUES

BACKGROUND

The present invention relates generally to semiconductor device processing techniques, and, more particularly, to a method and structure for integrating metal-insulator-metal (MIM) capacitors within dual damascene processing techniques.

In many mixed signal or high frequency RF applications, both high performance, high-speed capacitors and inductors are utilized. Low series resistance, low loss, high Q and low (RC) time constants are characteristic of such components in high frequency applications for achieving high performance. In addition, these device structures are fabricated by processes compatible with CMOS processing (e.g., using AlCu alloys, pure copper, Ti, TiN, Ta, and TaN, possibly in combination, in both subtractive-etch and dual damascene structures).

In particular, a metal-insulator-metal (MIM) capacitor is commonly used in high performance applications in CMOS technology. Typically, the MIM capacitor has a sandwich structure and can be described as a parallel plate capacitor. The capacitor top metal (CTM) is separated from the capacitor bottom metal (CBM) by a thin insulating dielectric layer. Both parallel plates are typically formed from metal films including, but limited to, Al, AlCu alloys, Ti, TiN, Ta, and TaN that are patterned and etched through the use of several photolithography photomasking steps. The thin insulating dielectric layer is typically made from silicon oxide or silicon nitride, deposited by chemical vapor deposition (CVD), for example.

Because conventional MIM capacitors utilize metal plates as upper electrodes, additional process steps beyond existing dual damascene methods are needed to fabricate the plates. In addition, the total thickness associated with the upper electrode and the MIM dielectric is approaching that of a dual damascene layer, thus making integration more difficult because of the resulting induced topography. Accordingly, it would be desirable to be able to produce MIM capacitors in a manner that results in as little additional processing as possible and that has a minimal effect on device topography.

SUMMARY

The foregoing discussed drawbacks and deficiencies of the prior art are overcome or alleviated by, in an exemplary embodiment, a method for integrating the formation of metal-insulator-metal (MIM) capacitors within dual damascene processing. The method includes forming a lower interlevel dielectric (ILD) layer having a lower capacitor electrode and one or more lower metal lines therein, the ILD layer having a first dielectric capping layer formed thereon. An upper ILD layer is formed over the lower ILD layer, and a via and upper line structure are defined within the upper ILD layer. The via and upper line structure are filled with a planarizing layer, followed by forming and patterning a resist layer over the planarizing layer. An upper capacitor electrode structure is defined in the upper ILD layer corresponding to a removed portion of the resist layer. The via, upper line structure and upper capacitor electrode structure are filled with conductive material, wherein a MIM capacitor is defined by the lower capacitor electrode, first dielectric capping layer and upper capacitor electrode structure.

In another embodiment, a method for integrating the formation of metal-insulator-metal (MIM) capacitors within dual damascene processing includes forming a lower interlevel dielectric (ILD) layer having a lower capacitor electrode and one or more lower metal lines having a selective metal cap thereon. A MIM capacitor dielectric structure is formed over the selective metal cap, an upper ILD layer is formed over the lower ILD layer, and a via and upper line structure is defined within the upper ILD layer. An upper capacitor electrode structure is defined in the upper ILD layer, and the via, upper line structure and upper capacitor electrode structure are filled with conductive material, wherein a MIM capacitor is defined by the lower capacitor electrode, the first dielectric capping layer, the MIM capacitor dielectric structure and the filled upper capacitor electrode structure.

In another embodiment, a method for integrating the formation of metal-insulator-metal (MIM) capacitors within dual damascene processing includes forming a lower interlevel dielectric (ILD) layer having a lower capacitor electrode and one or more lower metal lines therein, the ILD layer having a first dielectric capping layer formed thereon. An upper ILD layer is formed over the first dielectric capping layer, a first via structure is patterned over the one or more metal lines, and a plurality of MIM capacitor via structures is patterned over the lower capacitor electrode wherein the plurality of MIM capacitor via structures have smaller feature sizes with respect to the first via structure. The patterned first via structure and plurality of MIM capacitor via structures are etched into the upper ILD layer, wherein the first via structure is etched at a faster rate than the plurality of MIM capacitor via structures. Line openings are patterned and etched over the first via structure and the plurality of MIM capacitor via structures, wherein the first via structure is etched through the first dielectric capping layer while the plurality of MIM capacitor via structures are not etched through the first dielectric capping layer. The first via structure, the plurality of MIM capacitor via structures and the line openings are filled with conductive material, wherein a MIM capacitor is defined by the lower capacitor electrode, the first dielectric capping layer, the plurality of MIM capacitor via structures, and the line opening over the plurality of MIM capacitor via structures.

In another embodiment, a metal-insulator-metal (MIM) capacitor structure includes a lower interlevel dielectric (ILD) layer having a lower capacitor electrode formed therein, a first dielectric capping layer formed on the lower ILD layer and the lower capacitor electrode, an upper ILD layer formed over the first dielectric capping layer, and an upper capacitor electrode structure formed in the upper ILD layer and in contact with the first dielectric capping layer.

In another embodiment, a metal-insulator-metal (MIM) capacitor structure includes a lower interlevel dielectric (ILD) layer having a lower capacitor electrode formed therein, a selective metal cap formed on the lower capacitor electrode, a MIM capacitor dielectric structure formed over the selective metal cap, an upper ILD layer formed over the selective metal cap and the MIM capacitor dielectric structure, and an upper capacitor electrode structure formed in the upper ILD layer and in contact with the MIM capacitor dielectric structure.

In another embodiment, a metal-insulator-metal (MIM) capacitor structure includes a lower interlevel dielectric (ILD) layer having a lower capacitor electrode formed therein, a first dielectric capping layer formed on the lower ILD layer and the lower capacitor electrode, an upper ILD layer formed over the first dielectric capping layer, and an upper capacitor electrode structure formed in the upper ILD.

The upper capacitor electrode structure further includes a plurality of via structures filled with an electrically conductive material, a bottom end of the via structures in contact with the first dielectric capping layer, and a conductive line structure in contact with a top end of the via structures.

BRIEF DESCRIPTION OF THE DRAWINGS

Referring to the exemplary drawings wherein like elements are numbered alike in the several Figures.

DETAILED DESCRIPTION

Figure 1A:
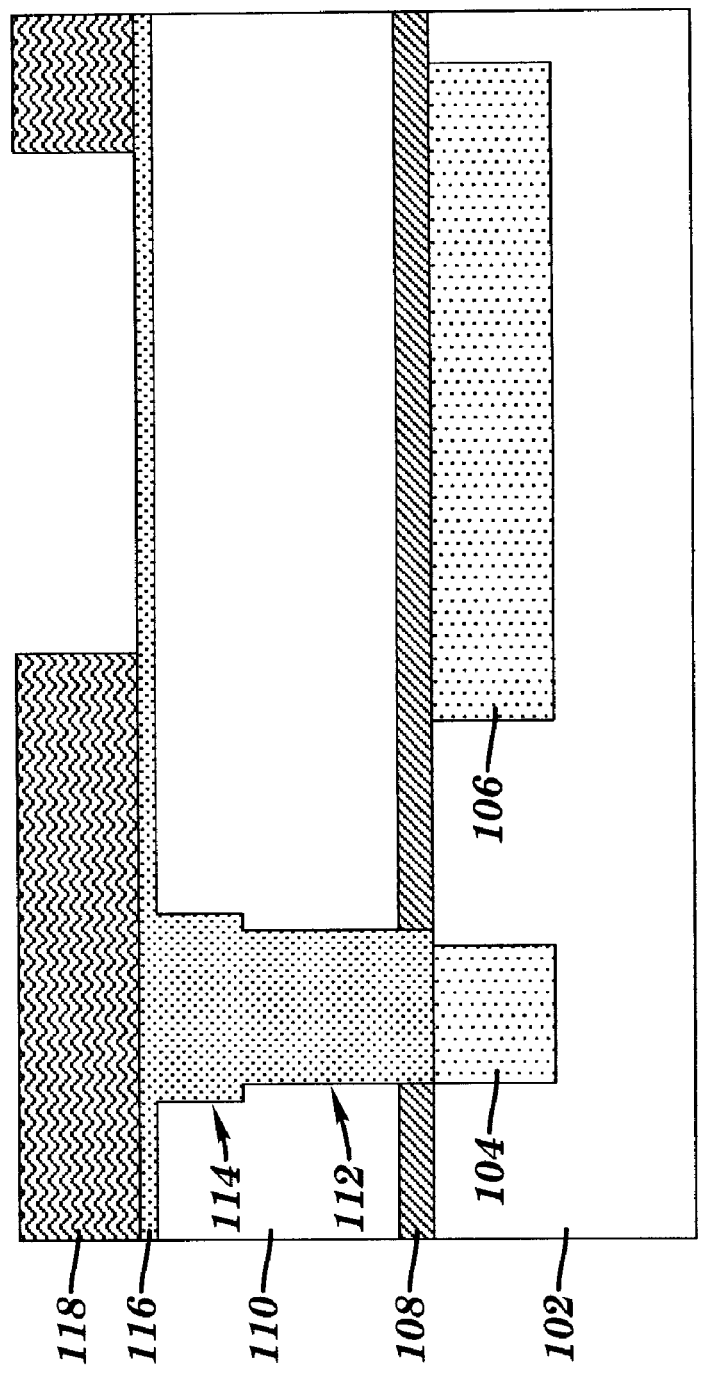
FIGS. 1(a) through 1(c) are a sequence of process flow steps illustrating a method for forming a MIM capacitor, in accordance with an exemplary embodiment of the invention.
Figure 1B:
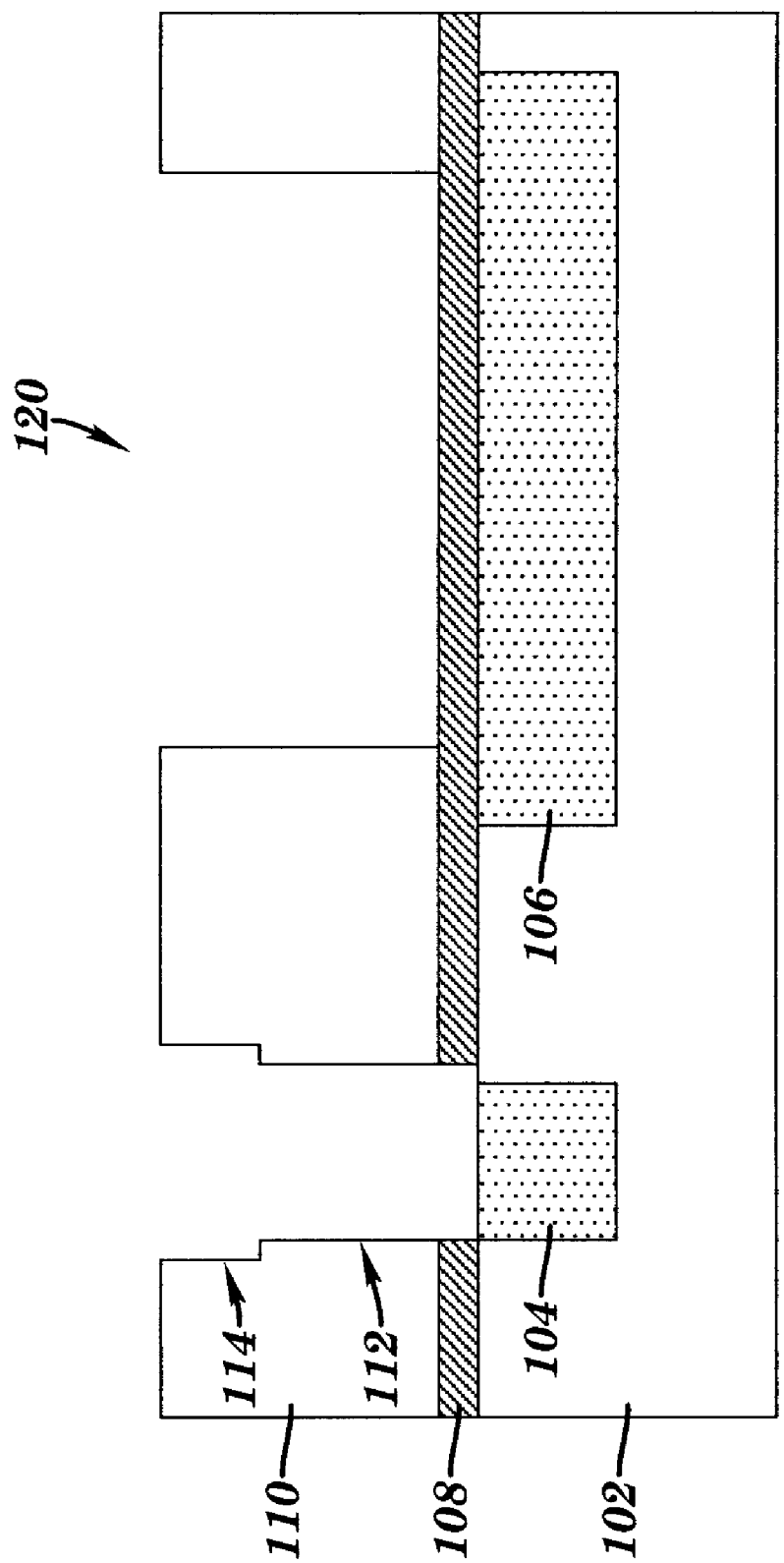
Figure 1C:
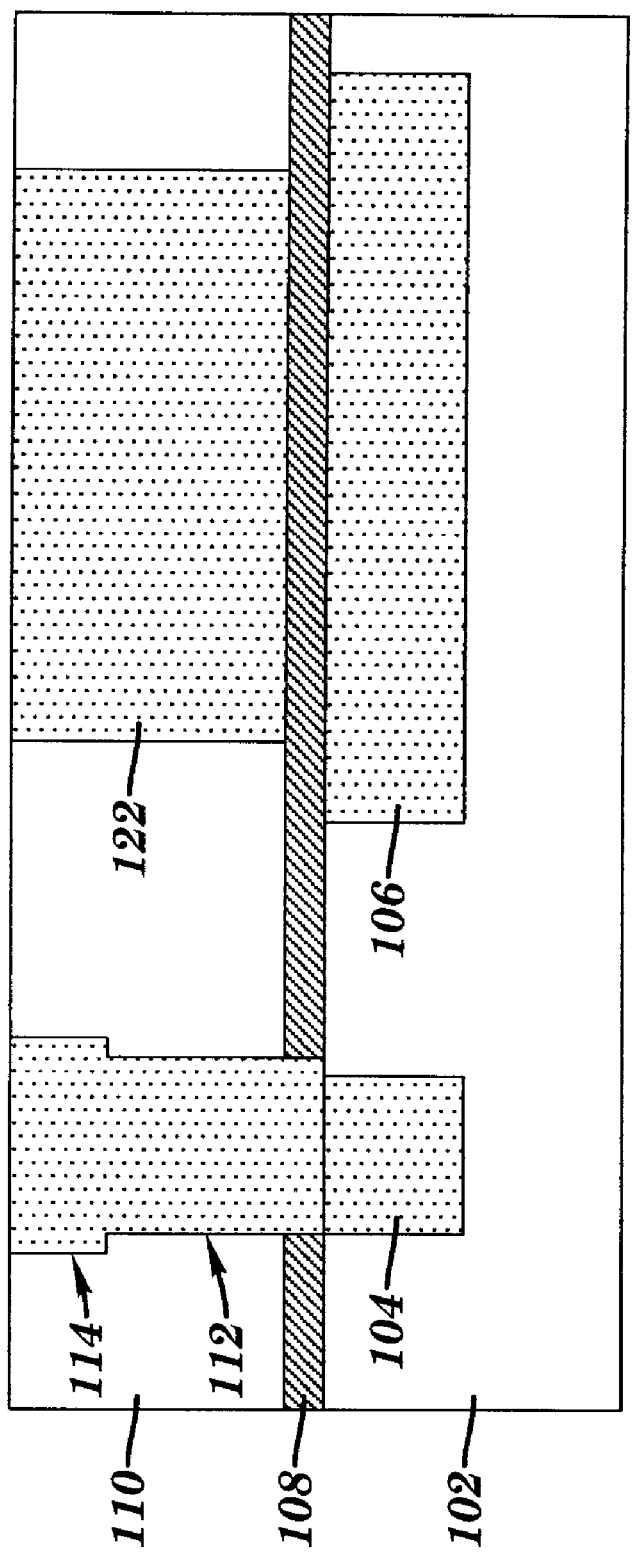

Referring initially to FIGS. 1(a) through 1(c), there is shown a sequence of process flow steps illustrating a method for forming a MIM capacitor, in accordance with an exemplary embodiment of the invention. As particularly shown in FIG. 1(a), a lower metal level of a dual damascene structure includes a lower interlevel dielectric (ILD) layer 102, having a lower metal line 104 and a lower MIM capacitor electrode 106 formed therein. In an exemplary embodiment, the ILD material is a low-K material (e.g., having a dielectric constant of about 2.0 to about 3.0 such as SiCOH, Black Diamond® from Applied Materials, Coral® from Novellus, and Aurora™ from ASM International), and the metal material of line 104 and electrode 106 is copper. A capping layer 108 of moderately higher dielectric constant (e.g., about 3.0 to about 6.0, such as BloK, NBLoK, SiC, SiCN) is formed over the lower metal level. Silicon nitride ($Si_3N_4$) having a dielectric constant of about 6.0 to about 7.0 could also be used as the capping layer 108.

In addition to the capping layer 108, an optional etch stop layer (e.g., $SiO_2$) (not shown in FIG. 1(a)) may also be formed over the capping layer 108, prior to formation of an upper ILD layer 110, which is generally of the same low-k material as lower ILD layer 102. As further depicted in the left portion of FIG. 1(a) above lower metal line 104, the upper ILD layer 110 has been etched to define a via 112 and upper trench 114 in accordance with dual damascene techniques. At this point, conventional processing is supplemented with a MIM capacitor (MIMCAP) via lithography process so as to define an upper MIMCAP electrode opening. In the embodiment shown, an organic planarizing layer 116 is used to fill the openings defined by via 112 and trench 114 so as to create a planar surface for resist layer 118. The resist layer 118 is then opened to expose a portion of the upper ILD layer 110 in which the upper electrode of the MIMCAP is to be defined.

As shown in FIG. 1(b), the upper electrode opening 120 is then etched, followed by an initial dry (plasma) strip to remove the resist 118 and etch residues, followed by a wet (solvent) strip (e.g., TMAH, NMP, AZ-400T) to remove any remaining resist, as well as the planarizing layer. This two-step, dry/wet strip avoids exposing bare metal in the lower level to the effects of a plasma strip. Thereafter, the upper ILD layer 110 is filled with metal and polished as shown in FIG. 1(c). In addition to the filled via 112 and trench 114 (which defines an upper line connected to lower line 104), a MIMCAP is formed, which includes lower electrode 106, dielectric (capping layer 108) and upper electrode 122.

Figure 2A:
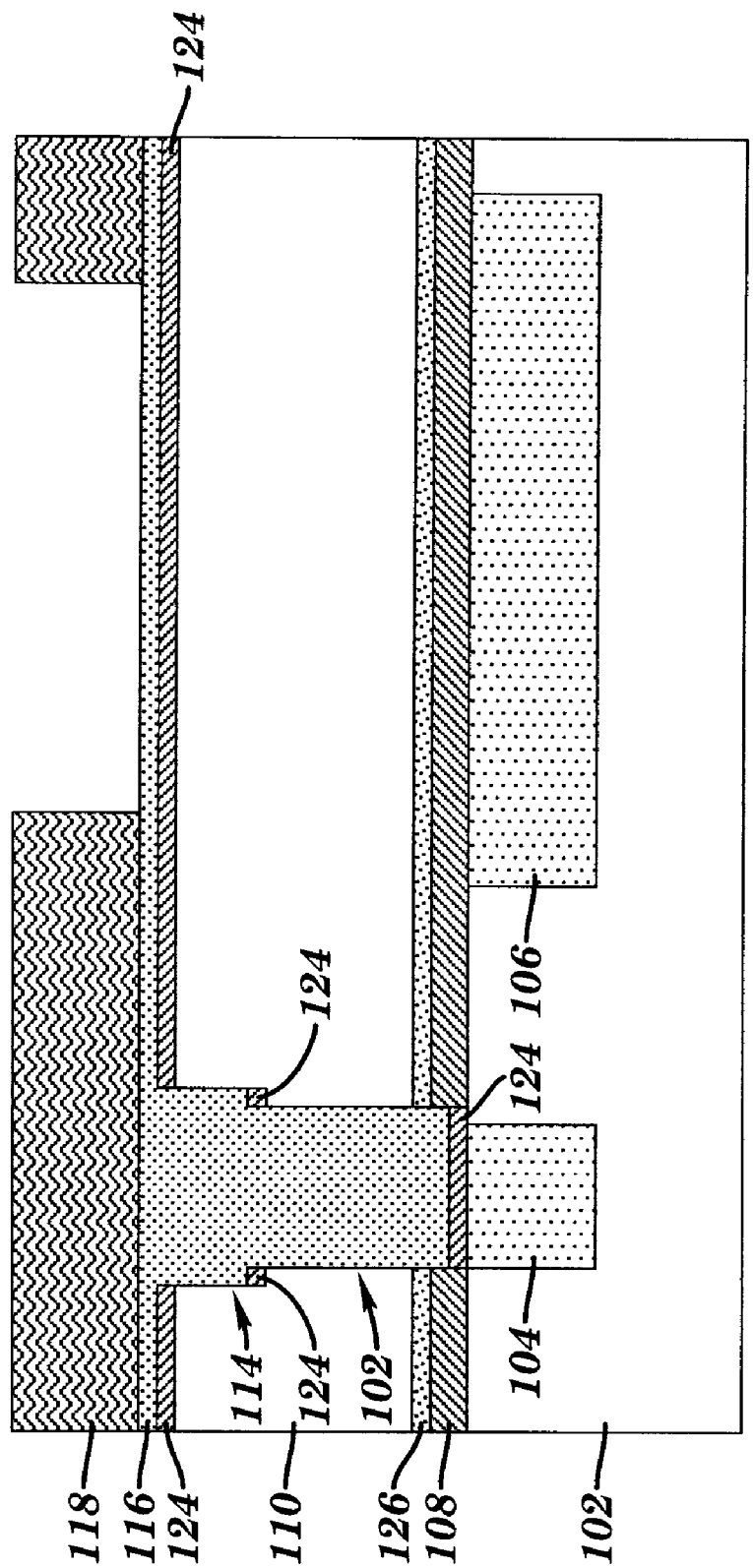
FIGS. 2(a) and 2(b) are a variation of the process flow steps of FIGS. 1(a) and 1(b), which integrates a passivating dielectric liner.
Figure 2B:
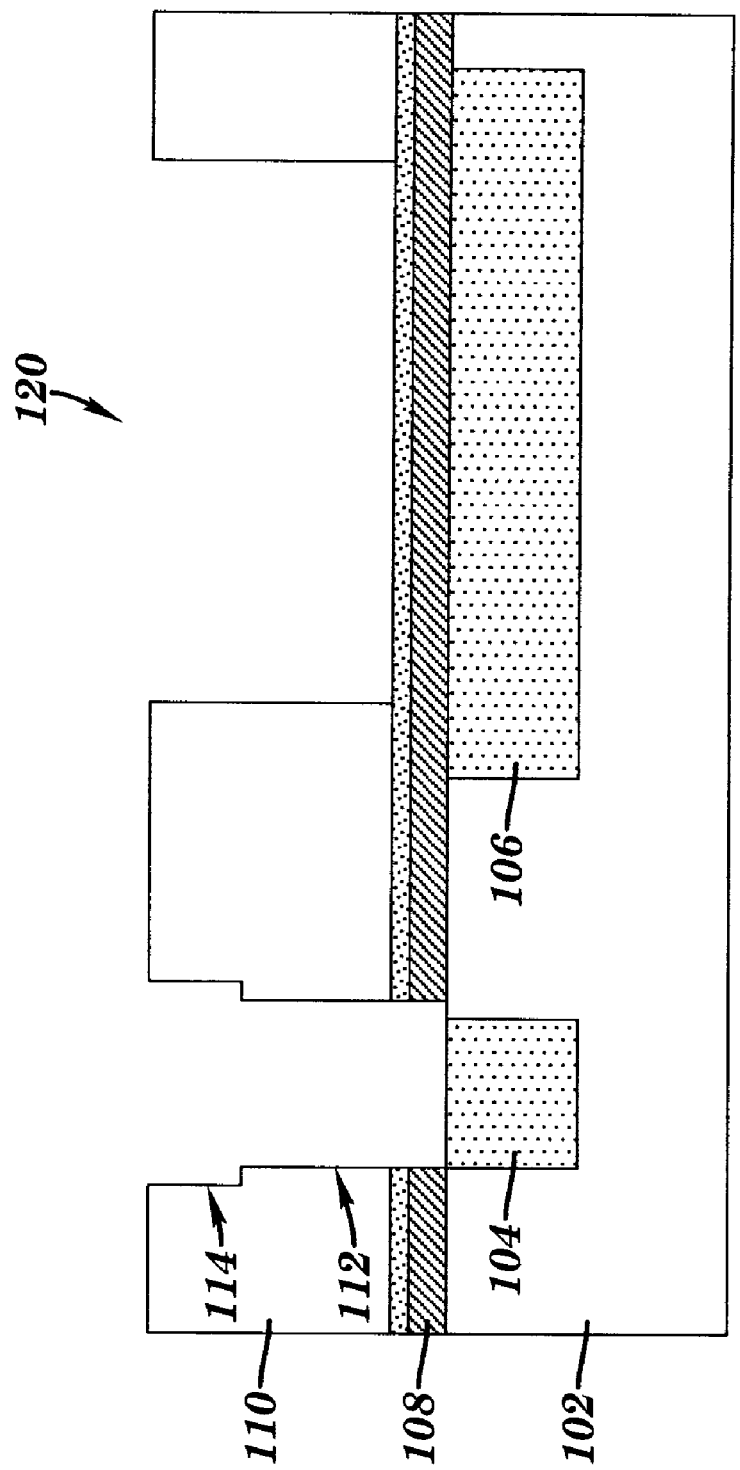

FIGS. 2(a) and 2(b) illustrate an alternative to the two-step resist strip following upper electrode definition of FIG. 1(a). In this embodiment, a non-conformal liner 124 (e.g., tantalum nitride, titanium nitride) is formed over the horizontal surfaces of the patterned upper level ILD 110, including exposed line 104. Similar to FIG. 1(a), an organic planarizing layer 116, which in this embodiment may be cross-linked, is used to fill the openings defined by via 112 and trench 114 so as to create a planar surface for resist layer 118. The resist layer 118 is then opened to expose a portion of the upper ILD layer 110 in which the upper electrode of the MIMCAP is to be defined, as shown in FIG. 2(a). As shown in FIG. 2(b), the upper electrode opening 120 is then etched, stopping on optional etch stop layer 126. Because of the presence of the conformal liner layer 124, a single plasma strip step may be used to remove the resist 118 and etch residues. Following etch residue removal, the upper level metal (including the upper MIMCAP electrode) is deposited and polished. As a consequence of the metal deposition process (e.g., sputtering), the non-conformal liner 124 may be removed from the via 112 in whole or in part.

Figure 3A:
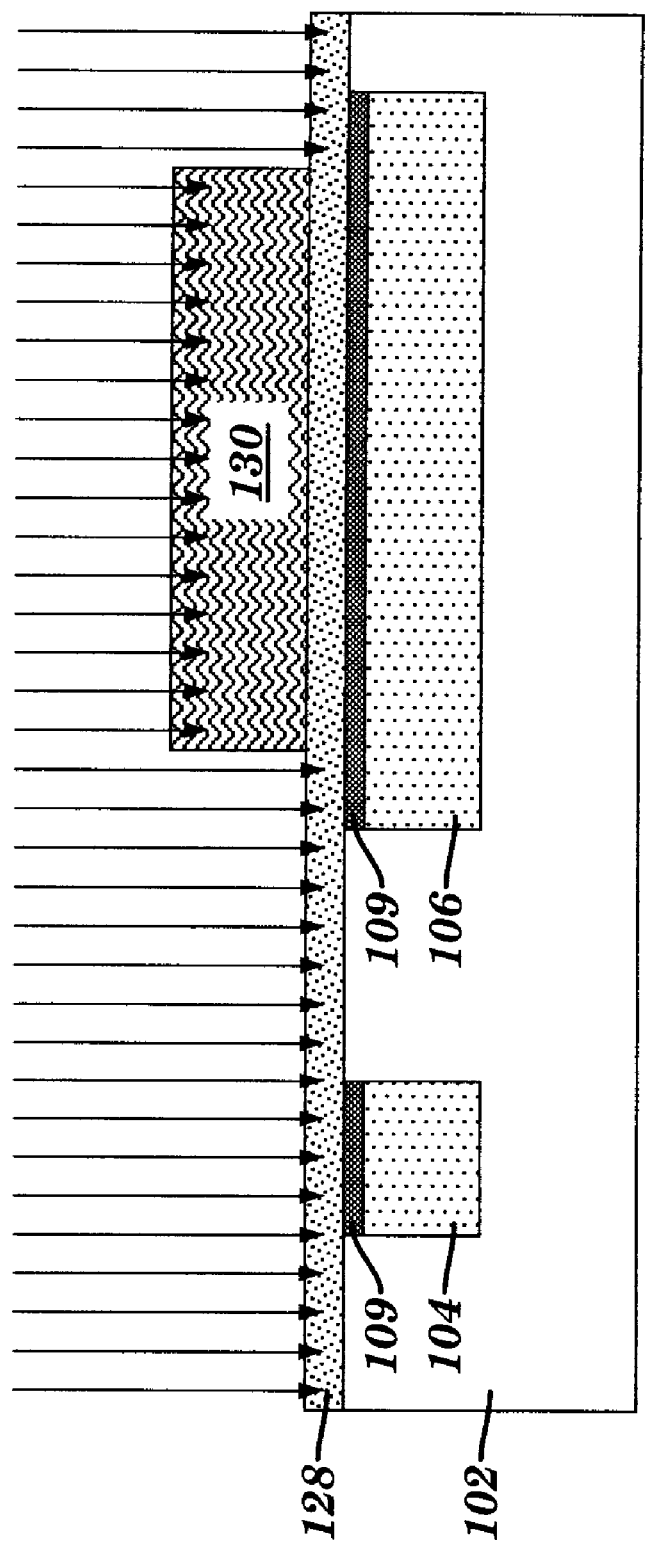
FIGS. 3(a) through 3(c) are a sequence of process flow steps illustrating a patterning technique for forming a high-K dielectric layer of a MIM capacitor, in accordance with another embodiment of the invention.
Figure 3B:
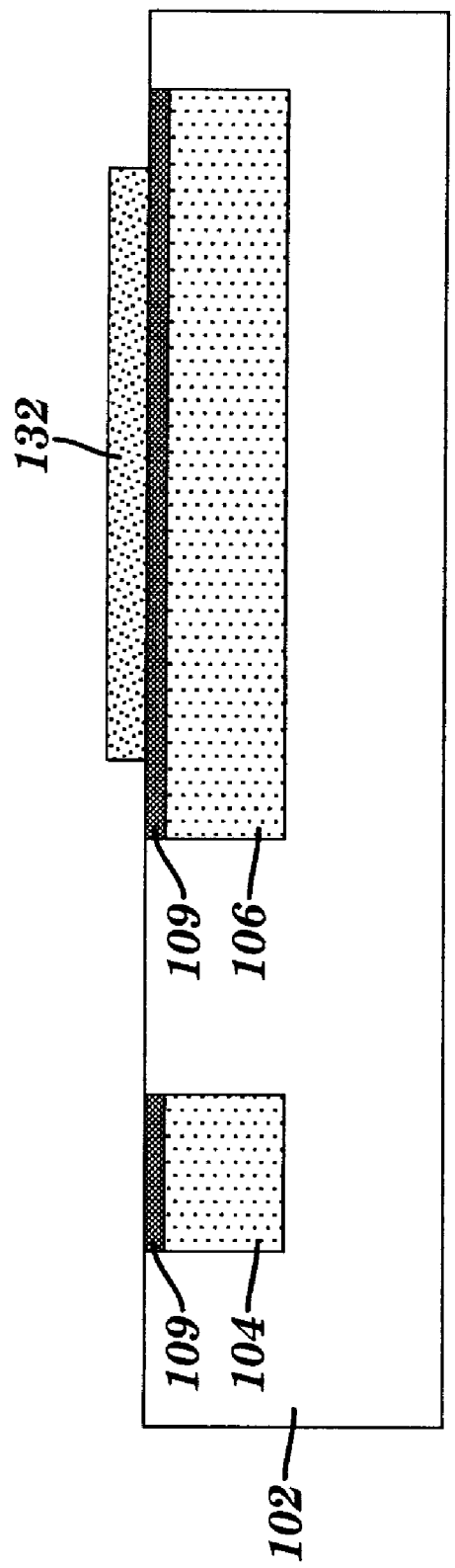
Figure 3C:
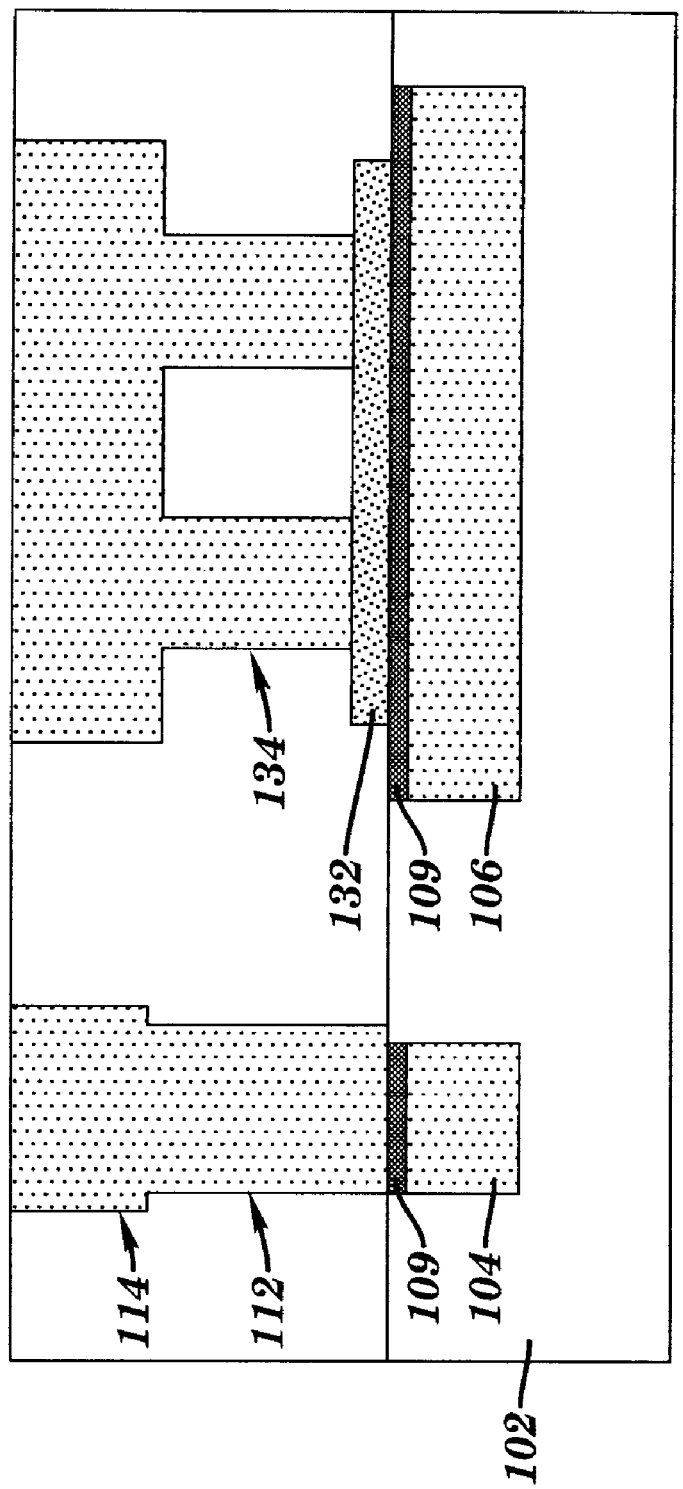

Referring now to FIGS. 3(a) through 3(c), there is shown a sequence of process flow steps illustrating a patterning technique for forming a high-K dielectric layer of a MIM capacitor, in accordance with another embodiment of the invention. After the formation of the lower level metal structures as described above, a selective metal capping process (e.g., CoWP) is used to passivate the copper line 104 and lower electrode 106, as shown by selective cap layers 109. A relatively high-K MIMCAP dielectric layer 128 is then formed over the lower metal structures as shown in FIG. 3(a). In an exemplary embodiment, the high-K MIMCAP dielectric is formed from a material such as $HfO_2$, $ZrO_2$, $TaO_2$ or other heavy metal silicates, for example. Silicon nitride could also be used for the high-K MIMCAP dielectric layer 128 as well. A resist layer 130 is patterned to define the location of the high-K MIMCAP dielectric layer. Then, the exposed portions of the high-K MIMCAP dielectric layer 128 are subjected to an ion implantation with a material such as fluorine, oxygen, or argon for example. The ion implantation renders the exposed high-K MIMCAP layer susceptible to removal through a DHF (dilute hydrofluoric acid) cleaning.

As a result, a high-K MIMCAP dielectric layer 132 is shown in FIG. 3(b). Subsequently, the upper ILD layer, via and trench formation may take place, followed by organic planarizing layer deposition prior to MIMCAP upper electrode lithography as described above. In the particular embodiment shown in FIG. 3(c), the upper electrode structure includes via formations 134. However, the upper electrode structure could also resemble that shown in FIG. 1(c).

Figure 4A:
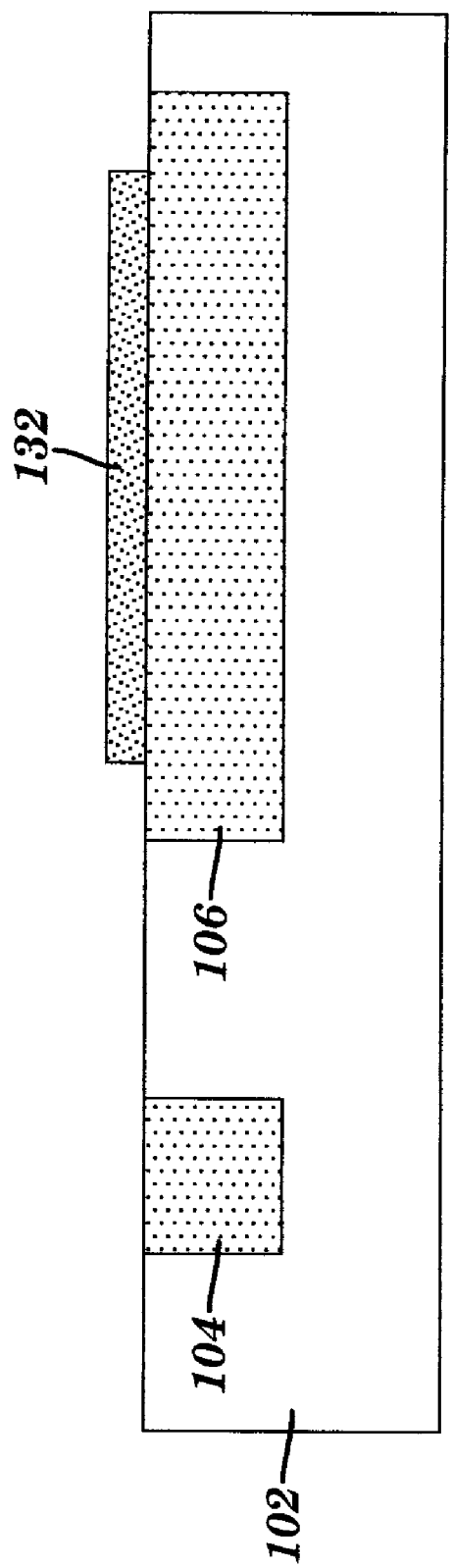
FIGS. 4(a) through 4(c) are a sequence of process flow steps illustrating an optional cap that may be formed over the embodiment of FIG. 3.
Figure 4B:
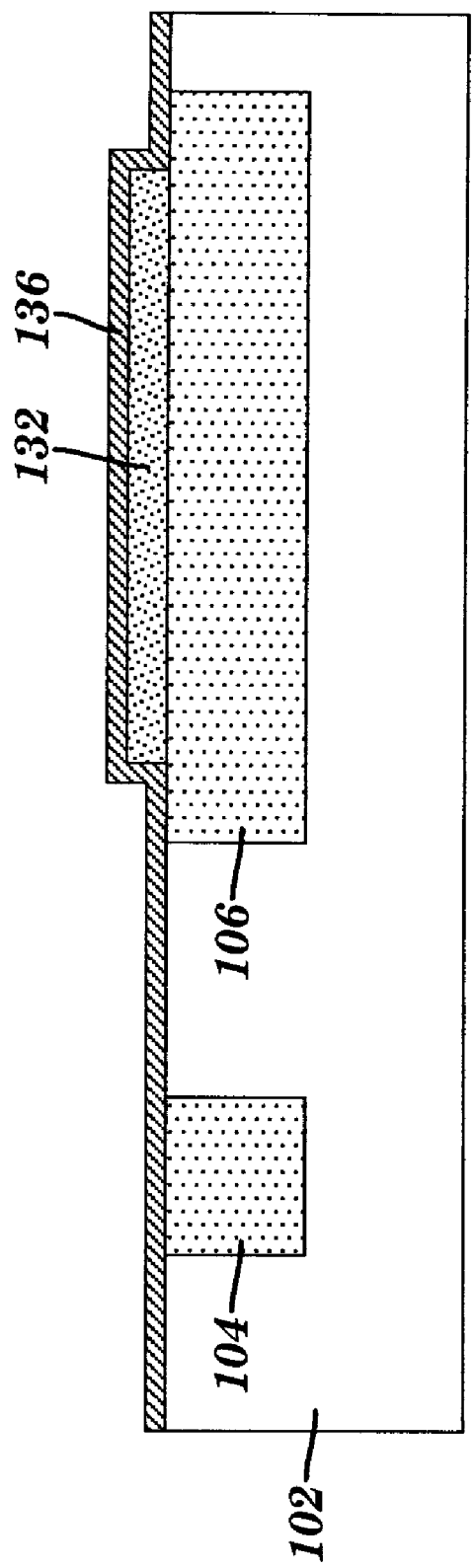
Figure 4C:
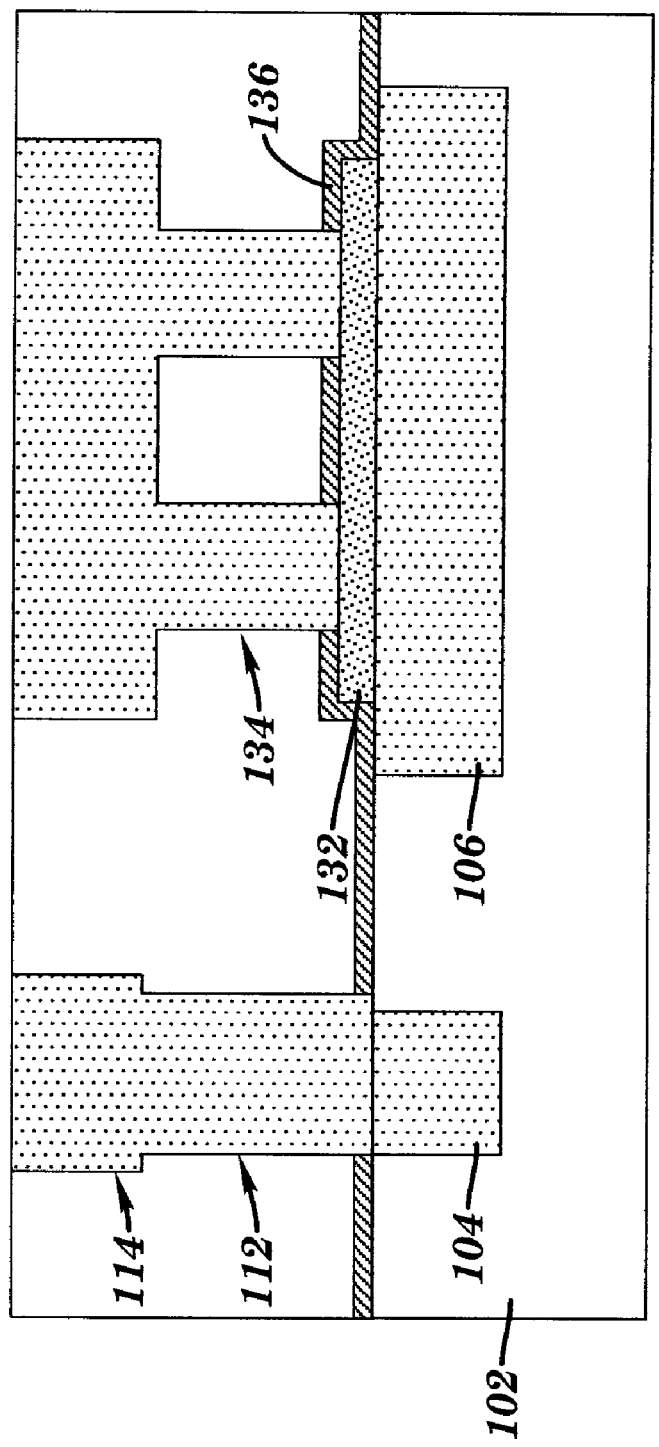

FIGS. 4(a) through 4(c) are a sequence of process flow steps illustrating an optional cap that may be formed over the embodiment of FIG. 3 (without selective cap layer 109). That is, following the patterning of high-K MIMCAP dielectric layer 132 in FIG. 4(a), a capping layer 136 is formed over the high-K MIMCAP dielectric layer 132, lower wire 104, lower electrode 106 and lower ILD layer 102 as shown in FIG. 4(b). In an exemplary embodiment, the capping layer 136 may be BloK, NBLoK, SiC, or SiCN. Thereafter, the upper ILD layer, via and trench formation may is carried out, followed by organic planarizing layer deposition prior to MIMCAP upper electrode lithography as described above and shown in FIG. 4(c).

Figure 5A:
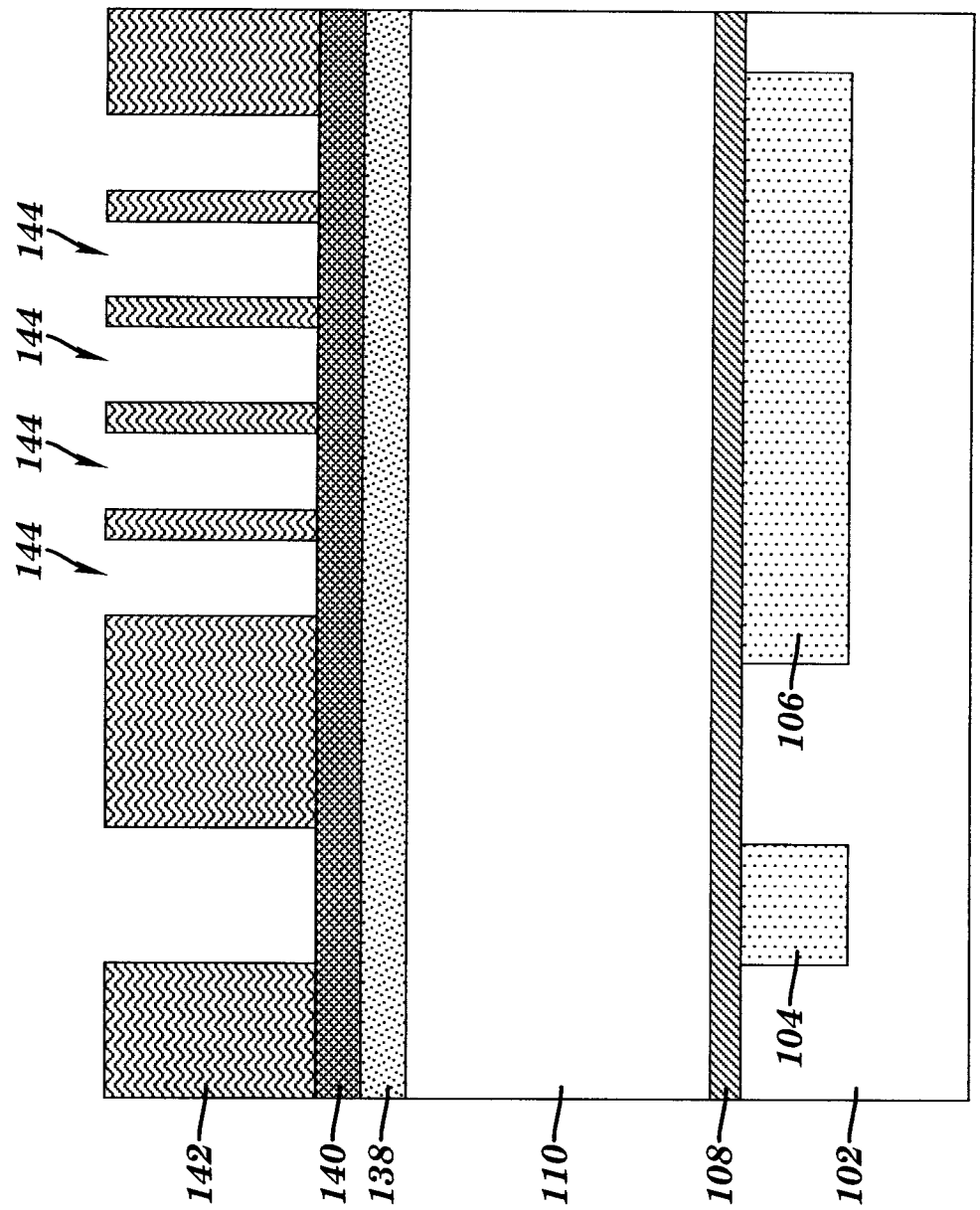
FIGS. 5(a) through 5(e) a sequence of process flow steps illustrating a method for forming a MIM capacitor, in accordance with another embodiment of the invention.
Figure 5B:
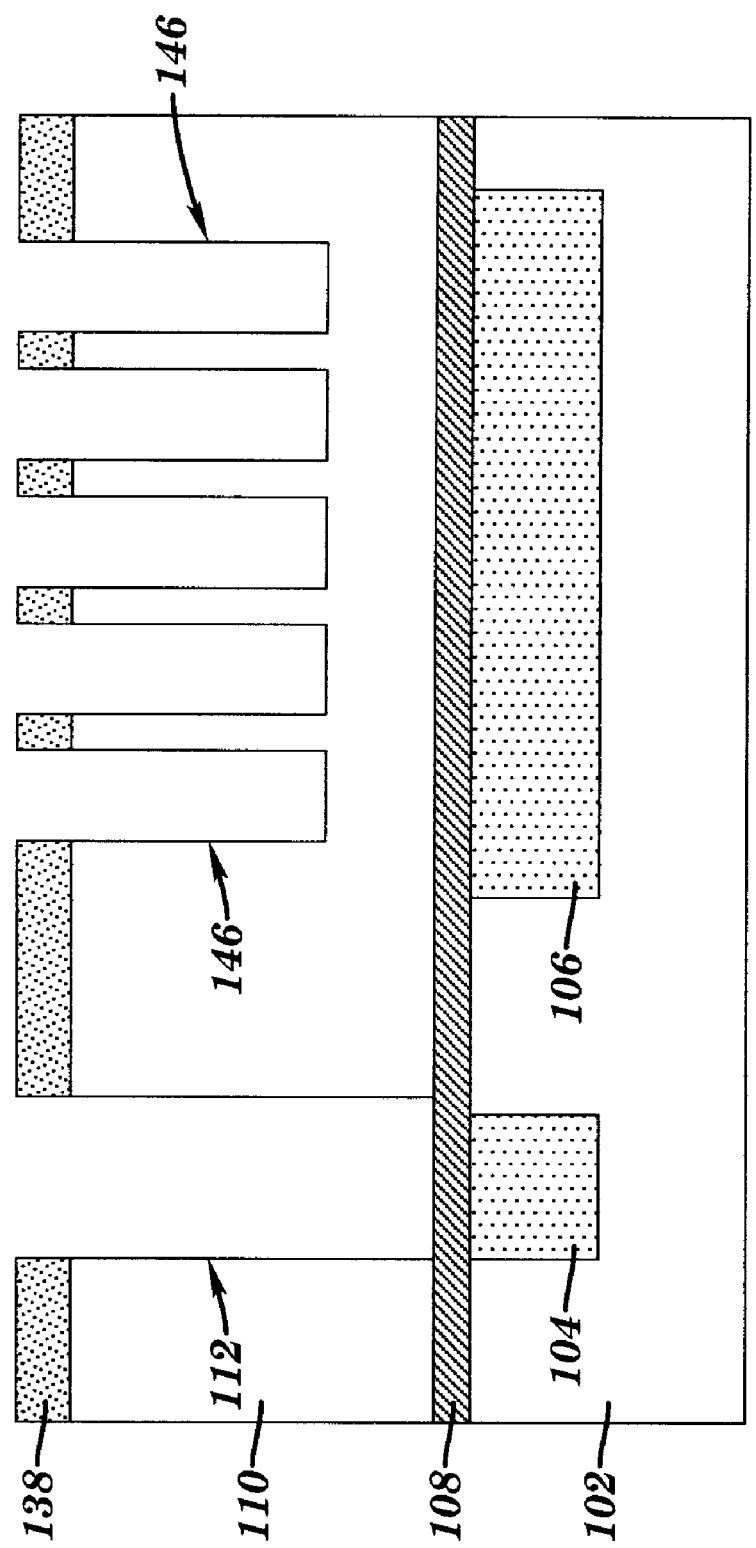

Finally, Figures through 5(a) through 5(e) a sequence of process flow steps illustrating a method for forming a MIM capacitor, in accordance with another embodiment of the invention. In FIG. 5(a), the upper ILD layer 110 is formed over capping layer 108, followed by a hardmask layer 138 (e.g., SiO₂, SiC), antireflective coating layer 140 and resist layer 142. In this embodiment, the metal line via etch is performed simultaneously with via etching on the MIMCAP side. However, the individual via patterns 144 for the MIMCAP side are defined in the resist layer 142 with smaller feature sizes so as to result in a lag effect during the actual etch. Thus, as shown in FIG. 5(b), the MIMCAP vias 146 etch at a slower rate than via 112. Where the capping layer 108 is used as an etch stop for via 112, it will be seen that vias 146 are not completely etched through upper ILD layer 110.

Figure 5C:
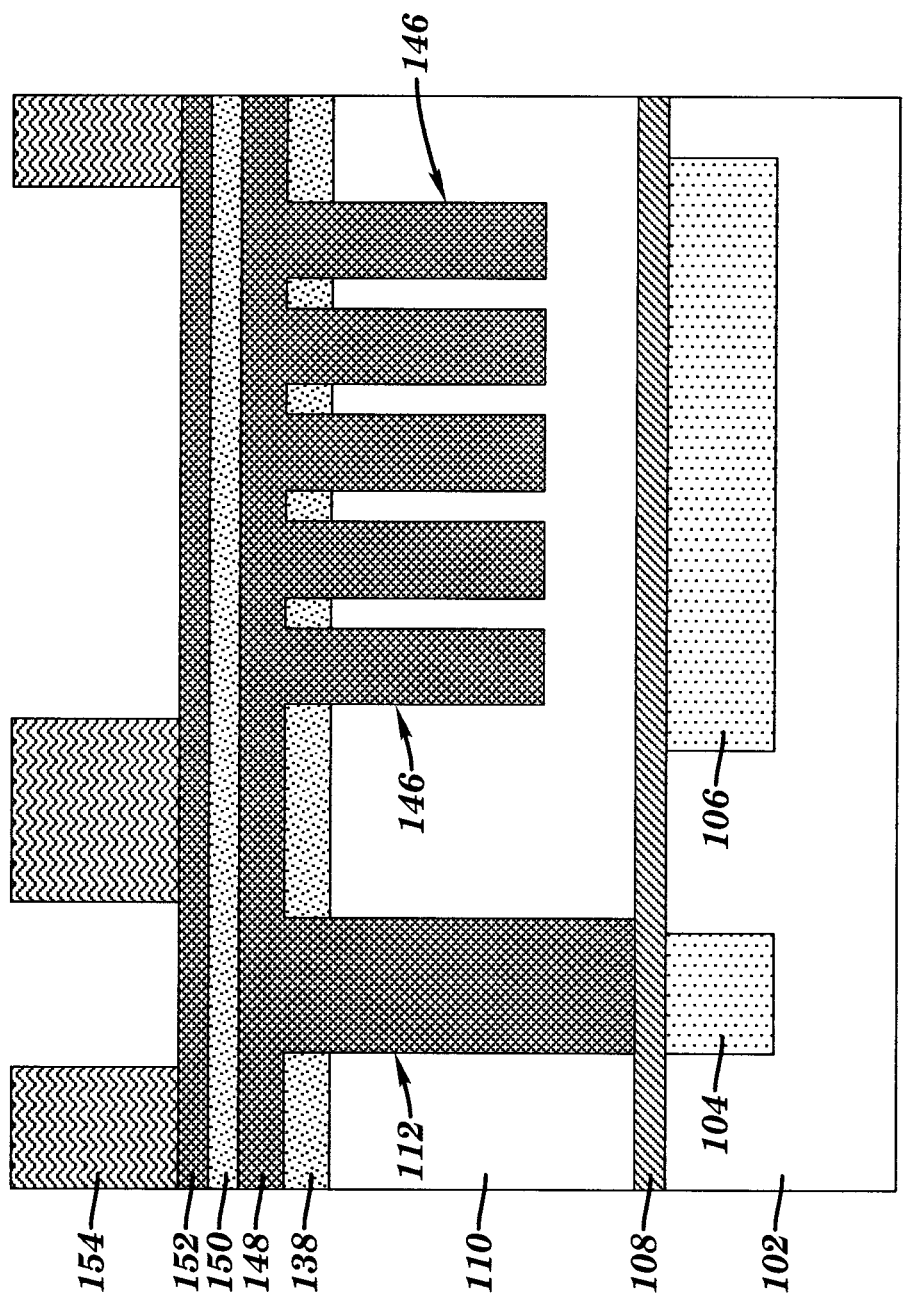
Figure 5D:
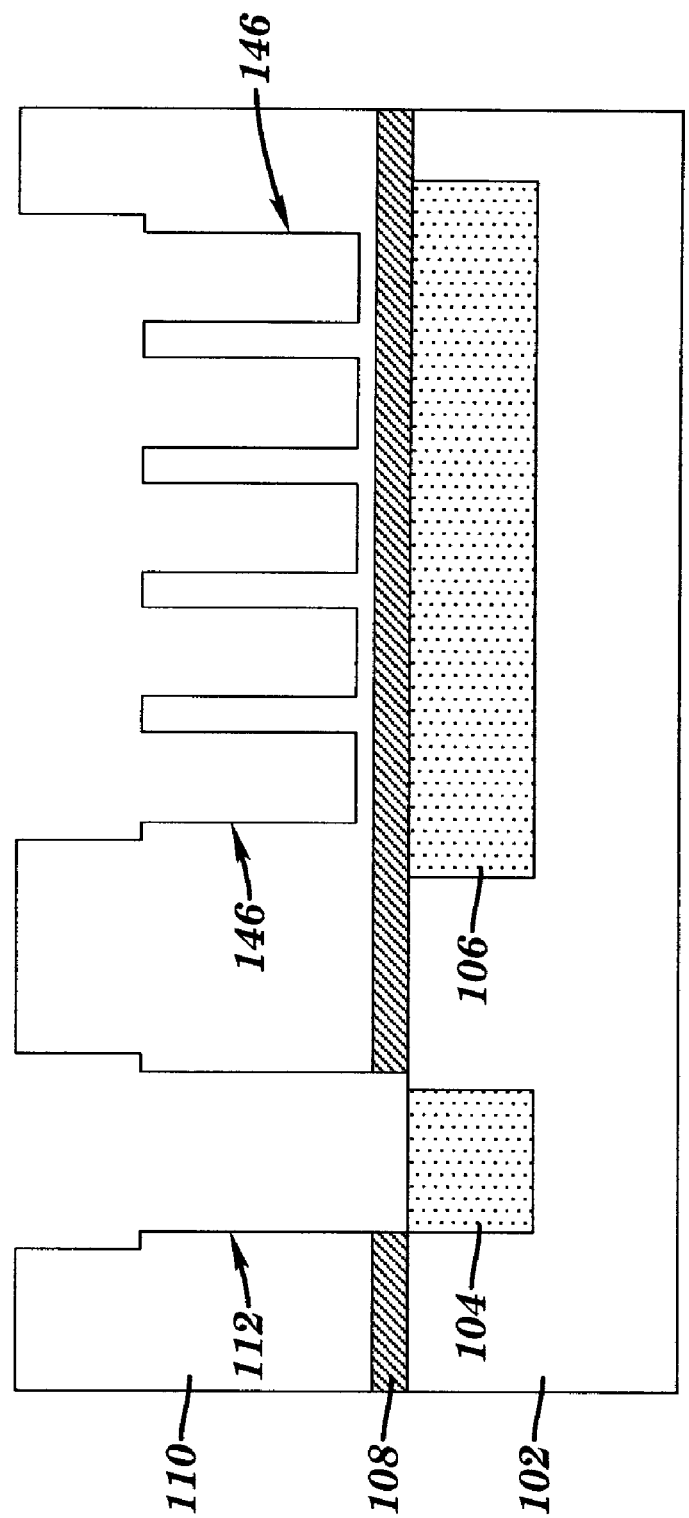
Figure 5E:
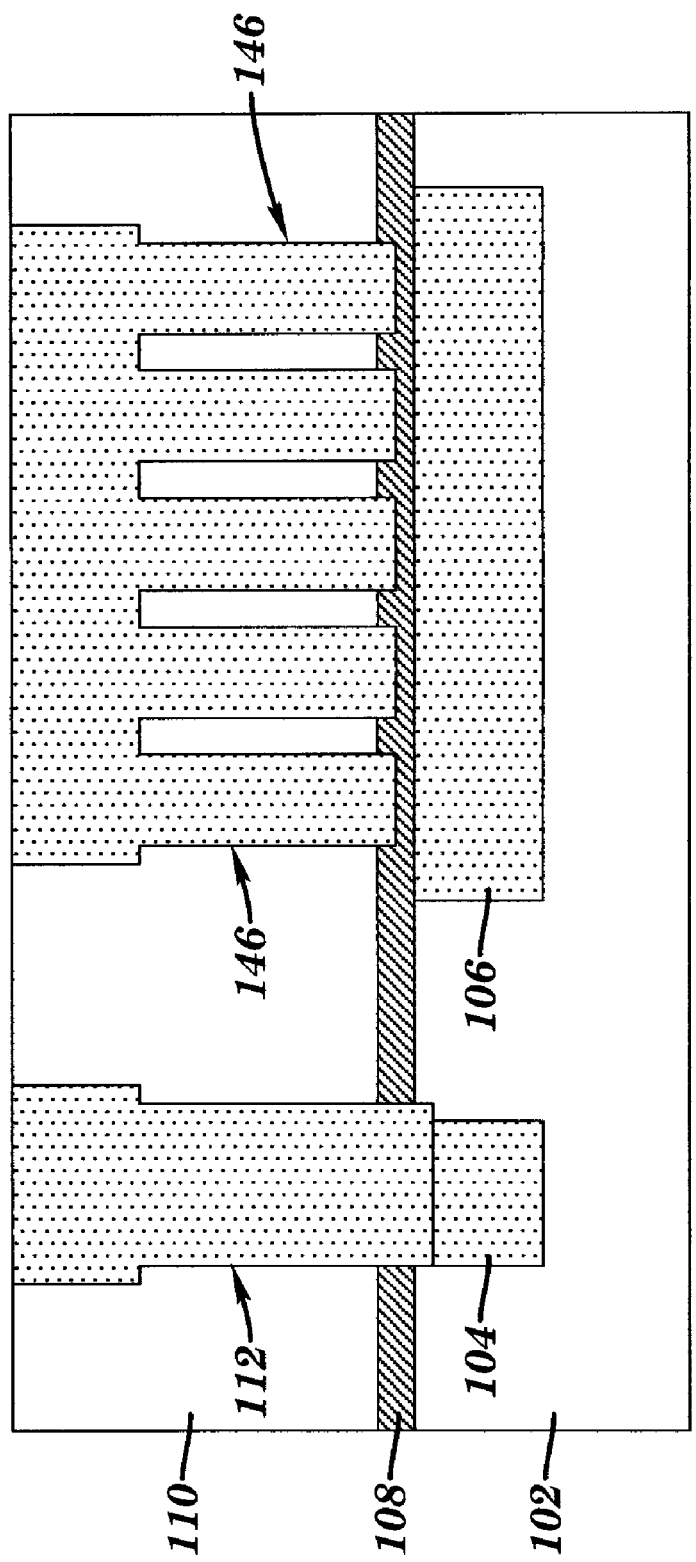

As then shown in FIG. 5(c), a cross-linking planarizing layer 148 is formed within the etch vias 112, 146 followed by a low-temperature oxide (LTO) cap 150 and antireflective coating layer 152. Another resist layer 154 is patterned to define line openings in both the MIMCAP and non-MIMCAP regions. This pattern is then shown transferred into upper ILD layer 110 in FIG. 5(d). It will further be noted that while via 112 has now etched through the cap layer 108, the smaller MIMCAP vias 146 have not punched through the cap layer 108. During the metal deposition and polishing process, sputtering may cause additional low-K ILD material to be removed such that vias 146 reach into (but do not punch through) cap layer 108, which serves as the MIMCAP dielectric layer in this embodiment.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for integrating the formation of metal-insulator-metal (MIM) capacitors within dual damascene processing, the method comprising:
    forming a lower interlevel dielectric (ILD) layer having a lower capacitor electrode and one or more lower metal lines therein, said ILD layer having a first dielectric capping layer formed thereon;
    forming an upper ILD layer over said lower ILD layer;
    defining a via and an upper line structure within said upper ILD layer;
    filling said via and upper line structure with a planarizing layer;
    forming and patterning a resist layer over said planarizing layer;
    defining an upper capacitor electrode structure in said upper ILD layer corresponding to a removed portion of said resist layer; and
    filling said via, said upper line structure and said upper capacitor electrode structure with conductive material, wherein a MIM capacitor is defined by said lower capacitor electrode, said first dielectric capping layer and said filled upper capacitor electrode structure.

2. The method of claim 1, wherein said defining an upper capacitor electrode structure in said upper ILD layer further comprises:
    etching said upper ILD layer;
    stripping a first portion of etch residue left from said etching using a dry plasma strip process; and
    removing a remaining portion of said etch residue using a wet solvent strip process.

3. The method of claim 1, wherein said defining an upper capacitor electrode structure in said upper ILD layer further comprises:
    depositing a non-conformal liner material following said defining said via and upper line structure; and
    stripping an entire portion of etch residue left from said etching using a dry plasma strip process, wherein said non-conformal liner material protects said one or more lower metal lines in said lower ILD layer.

4. The method of claim 3, wherein said non-conformal liner material further comprises one of: tantalum nitride and titanium nitride.

5. The method of claim 1, wherein:
    said upper and lower ILD layers have a dielectric constant of about 2.0 to about 3.0; and
    said first dielectric capping layer has a dielectric constant of about 3.0 to about 7.0.

6. The method of claim 1, wherein said planarizing layer comprises a cross-linking, organic planarizing layer.

7. A method for integrating the formation of metal-insulator-metal (MIM) capacitors within dual damascene processing, the method comprising:
    forming a lower interlevel dielectric (ILD) layer having a lower capacitor electrode and one or more lower metal lines therein, said lower capacitor electrode and one or more lower metal lines having a selective metal cap thereon;
    forming a MIM capacitor dielectric structure over said selective metal cap;
    forming an upper ILD layer over said lower ILD layer;
    defining a via and an upper line structure within said upper ILD layer;
    defining an upper capacitor electrode structure in said upper ILD layer; and
    filling said via, said upper line structure and said upper capacitor electrode structure with conductive material, wherein a MIM capacitor is defined by said lower capacitor electrode, said MIM capacitor dielectric structure and said filled upper capacitor electrode structure.

8. The method of claim 7, wherein said MIM capacitor dielectric structure comprises one of: HfO₂, ZrO₂, TaO₂ and Si₃N₄.

9. The method of claim 8, wherein said MIM capacitor dielectric structure is formed by:
    forming a MIM capacitor dielectric layer over said lower capacitor electrode and said one or more lower metal lines having a selective metal cap thereon;
    forming resist layer over said MIM capacitor dielectric layer;
    patterning said resist layer so as to maintain said resist layer over a location corresponding to said MIM capacitor dielectric structure;
    subjecting exposed portions of said MIM capacitor dielectric layer to an ion implantation; and
    removing said exposed, ion-implanted portions of MIM capacitor dielectric layer through a rinse process.

10. The method of claim 9, wherein said rinse process is implemented with diluted hydrofluoric acid (DHF).

11. The method of claim 9, wherein said ion implantation comprises one of fluorine, oxygen, or argon.

12. The method of claim 7, wherein:
said upper and lower ILD layers have a dielectric constant of about 2.0 to about 3.0; and
said MIM capacitor dielectric structure has a dielectric constant of greater than about 7.0.

13. The method of claim 7, further comprising forming a dielectric capping layer over said MIM capacitor dielectric structure prior to forming said upper ILD layer.

14. The method of claim 13, wherein said dielectric capping layer has a dielectric constant of about 3.0 to about 7.0.

15. The method of claim 14, wherein said first and second dielectric capping layers comprise a silicon carbide material.

16. A method for integrating the formation of metal-insulator-metal (MIM) capacitors within dual damascene processing, the method comprising:
forming a lower interlevel dielectric (ILD) layer having a lower capacitor electrode and one or more lower metal lines therein, said ILD layer having a first dielectric capping layer formed thereon;
forming an upper ILD layer over said first dielectric capping layer;
patterning a first via structure over said one or more metal lines, and patterning a plurality of MIM capacitor via structures over said lower capacitor electrode wherein said plurality of MIM capacitor via structures have smaller feature sizes with respect to said first via structure;
etching said patterned first via structure and plurality of MIM capacitor via structures into said upper ILD layer wherein said first via structure is etched at a faster rate than said plurality of MIM capacitor via structures;
patterning and etching line openings over said first via structure and said plurality of MIM capacitor via structures, wherein said first via structure is etched through said first dielectric capping layer while said plurality of MIM capacitor via structures are not etched through said first dielectric capping layer; and
filling said first via structure, said plurality of MIM capacitor via structures, and said line openings with conductive material, wherein a MIM capacitor is defined by said lower capacitor electrode, said first dielectric capping layer, said plurality of MIM capacitor via structures, and said line opening over said plurality of MIM capacitor via structures.

17. The method of claim 16, further comprising filling said etched first via structure and plurality of MIM capacitor via structures with a planarizing layer, forming a low-temperature oxide layer over said planarizing layer and forming an antireflective coating layer over said low-temperature oxide layer prior to said patterning and etching said line openings.

18. The method of claim 16, wherein:
said upper and lower ILD layers have a dielectric constant of about 2.0 to about 3.0; and
said first dielectric capping layer has a dielectric constant of about 3.0 to about 7.0.

19. The method of claim 17, wherein said planarizing layer comprises a cross-linking, organic planarizing layer.

* * * * *